United States Patent [19]

Countryman et al.

[11] Patent Number: 5,448,182
[45] Date of Patent: Sep. 5, 1995

[54] DRIVER CIRCUIT WITH SELF-ADJUSTING IMPEDANCE MATCHING

[75] Inventors: Roger S. Countryman, Austin, Tex.; Sunil Khatri, El Cerrito, Calif.

[73] Assignee: Motorola Inc., Schaumburg, Ill.

[21] Appl. No.: 236,819

[22] Filed: May 2, 1994

[51] Int. Cl.6 ........................................... H03K 17/16
[52] U.S. Cl. ......................................... 326/30; 326/34; 326/83
[58] Field of Search ............... 307/443, 473, 475, 264; 326/29, 30, 34, 83

[56] References Cited

U.S. PATENT DOCUMENTS

| | | | |
|---|---|---|---|
| 4,707,620 | 11/1987 | Sullivan et al. | 307/270 |
| 4,719,369 | 1/1988 | Asano et al. | 307/443 |
| 5,095,231 | 3/1992 | Sartori et al. | 307/475 |
| 5,107,230 | 4/1992 | King | 307/264 X |
| 5,134,311 | 7/1992 | Biber et al. | 307/443 X |
| 5,144,165 | 9/1992 | Dhong et al. | 307/451 |
| 5,294,845 | 3/1994 | McMahan et al. | 307/443 |
| 5,296,756 | 3/1994 | Patel et al. | 307/443 |
| 5,298,804 | 3/1994 | Shichinohe | 307/475 |
| 5,332,932 | 7/1994 | Runaldue | 307/443 |
| 5,341,039 | 8/1994 | Fukumoto | 307/443 |

OTHER PUBLICATIONS

"MC68040 MC68EC040 MC68LC040 Microprocessors User's Manual", Motorola Inc., 1992, pp. 7–68.

*Primary Examiner*—David R. Hudspeth
*Attorney, Agent, or Firm*—Daniel D. Hill

[57] ABSTRACT

A CMOS driver circuit (20) has a high impedance driver (30) and a low impedance driver (36) connected to the near end of a transmission line (43). The output impedance of the high impedance driver (30) matches the characteristic impedance of the transmission line (43). As a digital signal from the CMOS driver circuit (20) transitions from one logic state to another, the low impedance driver (30) drives the transmission line (43) until a predetermined voltage before the signal reaches its steady state voltage. A sensing circuit (24) senses when the predetermined voltage is reached, and in response, provides a control signal to deactivate the low impedance driver (36). The high impedance driver (30) completes the signal transition. The high impedance driver (30) absorbs the reflected waves from the far end of the transmission line (43), reducing the effects of ringing, and increasing noise immunity.

21 Claims, 2 Drawing Sheets

DRIVER CIRCUIT WITH SELF-ADJUSTING IMPEDANCE MATCHING

FIELD OF THE INVENTION

This invention relates generally to circuits, and more particularly, to a driver circuit with self-adjusting impedance matching.

BACKGROUND OF THE INVENTION

In integrated circuits, such as microprocessors, memories, and the like, signals may be routed for relatively long distances using transmission lines. A transmission line may be a bus, a printed circuit board trace, or other type of relatively long metal line for transporting a digital signal. Typically, a printed circuit board trace has a characteristic impedance of between 50 and 75 ohms. In CMOS (complementary metal-oxide semiconductor) circuits, the input impedance of a gate of a CMOS transistor is usually very high. The receiving end, or far end, of the transmission line is typically connected to an input of a logic circuit, where the input impedance is higher than the characteristic impedance of the transmission line. If the impedance coupled to the far end of the transmission line is different than the impedance of the near end, or sending end impedance, the signal may be reflected back to the sending end, causing the signal to overshoot a planned steady state voltage for the logic state. The signal may be reflected back and forth many times between the near end and the far end, causing oscillatory behavior of the signal at both ends. This repeated overshooting and undershooting of the signal is commonly known as "ringing", and results in reduced noise immunity and increased time for the signal to become, and remain, valid at the far end. Impedance matching is the practice of matching the impedance of the driver and/or the load to the characteristic impedance of the transmission line to facilitate the most efficient transfer of power.

A driver circuit is used to provide enough current to "drive" a signal the length of the transmission line. A CMOS driver circuit commonly includes a P-channel transistor and an N-channel transistor connected in series between a positive power supply voltage terminal and a ground terminal. The gates of the transistors receive an input signal, and an output terminal of the driver circuit is located between the transistors. The P-channel transistor functions as a "pull-up" transistor, and the N-channel transistor functions as a "pull-down" transistor. The output impedance of the driver circuit should match the characteristic impedance of the transmission line in order for the driver circuit to absorb the reflected signal and prevent ringing. This would result in quieter waveforms, better noise immunity, and improved signal timing margin.

When driving a digital signal, it is desirable for the signal to transition from one logic state to another logic state very quickly. To increase the driving capability of a CMOS driver, the size of the P-channel and N-channel transistors are increased. However, increasing the size of the transistors also lowers the resistance of the transistors. A CMOS driver with an output impedance of 50–75 ohms to match the transmission line characteristic impedance would be too weak to switch the transmission line fast enough, for most reasonably sized transmission lines.

SUMMARY OF THE INVENTION

A driver circuit with self-adjusting impedance matching has a driver circuit and a sensing circuit. The driver circuit includes a first driver portion and a second driver portion. The first and second driver portions are both coupled to an output terminal. The first driver portion has a first impedance and the second driver portion has a second impedance. The driver circuit drives an output signal at the output terminal with both the first driver portion and the second driver portion in response to a control signal being at a first logic state. In response to the control signal being at a second logic state, the first driver portion is disabled, and the driver circuit drives the output signal with the second driver portion. The sensing circuit senses when the output signal reaches a predetermined voltage during of a transition of the output signal from a first voltage level to a second voltage level. In response to the output signal reaching the predetermined voltage, the sensing circuit causes the control signal to change from the first logic state to the second logic state. These and other features and advantages will be more clearly understood from the following detailed description taken in conjunction with the accompanying drawings.

DESCRIPTION OF A PREFERRED EMBODIMENT

Generally, the present invention provides a driver circuit with self-adjusting impedance matching. This is accomplished by having a first driver circuit with a relatively low output impedance and a second driver circuit with a relatively high output impedance coupled to a transmission line. A sensing circuit senses the logic state of the near end of the transmission line. The first driver circuit drives the transmission line until an output voltage on the transmission line nears its steady state value, then the first driver circuit is disconnected from the transmission line and the second driver circuit stays connected to the transmission line. This results in the output signal exhibiting minimal ringing, which allows for improved noise margin and higher operating speeds.

Figure 1:
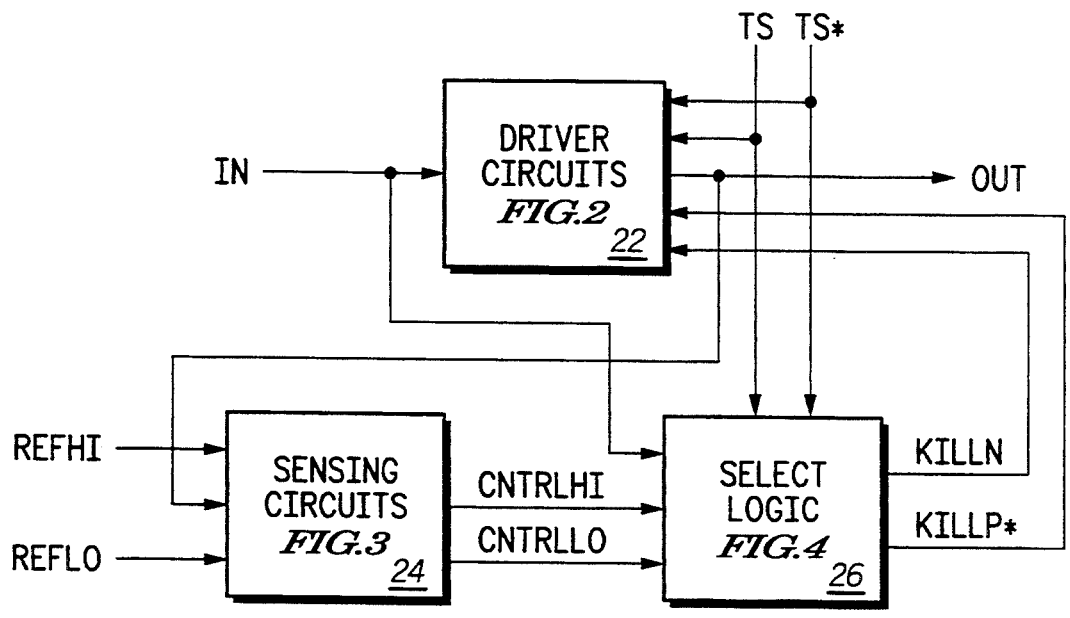
FIG. 1 illustrates in block diagram form, a CMOS driver driver circuit in accordance with the present invention.

The present invention can be more fully described with reference to FIG. 1-4. FIG. 1 illustrates in block diagram form, CMOS driver circuit 20 in accordance with the present invention. CMOS driver circuit 20 includes driver circuits 22, sensing circuits 24, and select logic circuits 26.

Driver circuits 22 have a first input terminal for receiving an input signal labeled "IN", second and third input terminals for receiving complementary control signals labeled "TS", and "TS*", respectively, an output terminal for providing an output signal labeled "OUT", a fourth input terminal for receiving a control signal labeled "KILLN", and a fifth input terminal for receiving a control signal labeled "KILLP*". Note that an asterisk (*) after a signal name indicates that the signal is a logical complement of a signal having the same name but lacking the asterisk, except that a logical complement for control signal KILLP* is not illustrated. Also note that control signal KILLN is active at a logic high, and control signal KILLP* is active at a logic low.

Sensing circuits 24 have a first input terminal for receiving a reference voltage labeled "REFHI", a second input terminal for receiving a reference voltage labeled "REFLO", a third input terminal connected to the output terminal of driver circuits 22 for receiving output signal OUT, a first output terminal for providing an active low control signal labeled "CNTRLHI", and a second output terminal for providing an active high control signal labeled "CNTRLLO".

Select logic circuit 26 has a first input terminal connected to the first input terminal of driver circuits 22 for receiving input signal IN, a second input terminal connected to the first output terminal of sensing circuits 24 for receiving control signal CNTRLHI, a third input terminal connected to the second output terminal of sensing circuits 24 for receiving control signal CNTRLLO, a fourth input terminal for receiving control signal TS, a fifth input terminal for receiving control signal TS*, a first output terminal coupled to the fourth input terminal of driving circuits 22 for providing control signal KILLN, and a second output terminal coupled to the fifth input terminal of driving circuits 22 for providing control signal KILLP*.

The operation of CMOS driver circuit 20 will be discussed with reference to FIGS. 2–4.

Figure 2:
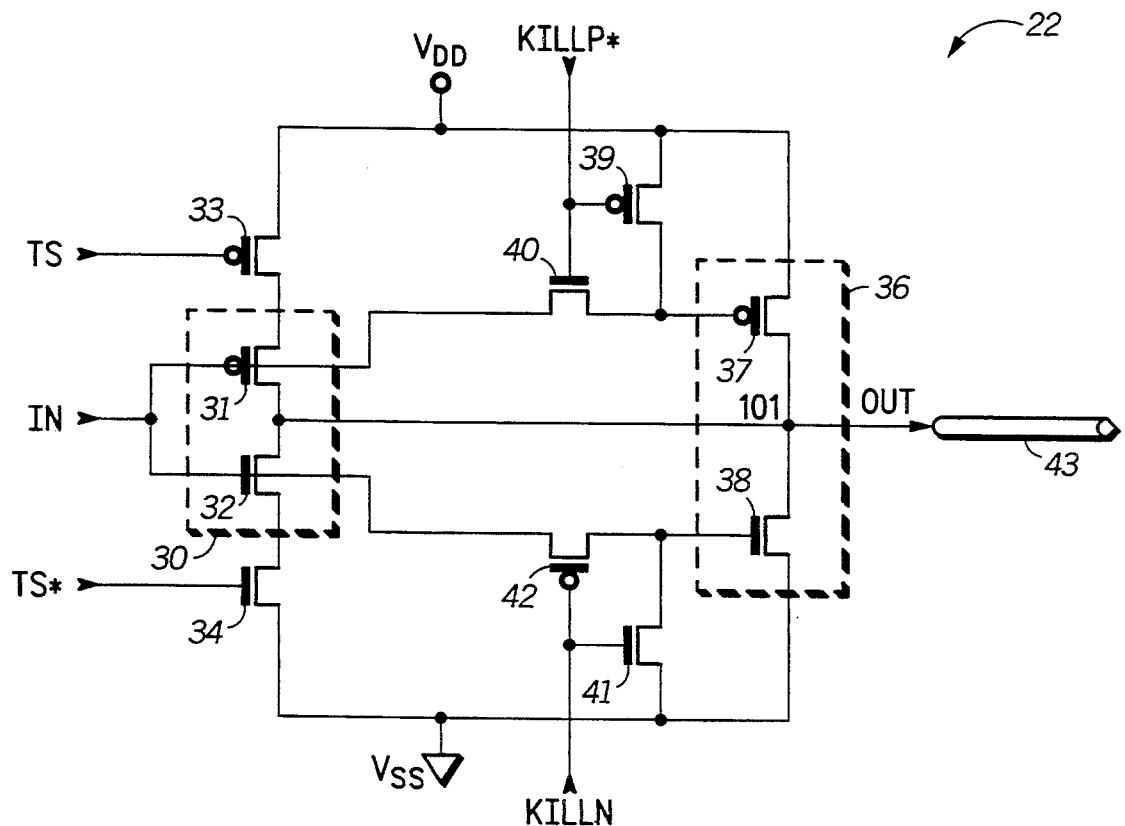
FIG. 2 illustrates in schematic diagram form, the driver circuits of FIG. 1.

FIG. 2 illustrates in schematic diagram form, driver circuits 22 of FIG. 1. Driver circuits 22 includes high impedance driver circuit portion 30, low impedance driver circuit portion 36, P-channel transistors 33, 39, and 42, and N-channel transistors 34, 40, and 41. Driver circuit portion 30 includes P-channel transistor 31 and N-channel transistor 32. Driver circuit portion 36 includes P-channel transistor 37 and N-channel transistor 38.

P-channel transistor 33 has a source connected to a power supply voltage terminal labeled "$V_{DD}$", a gate for receiving control signal TS, and a drain. P-channel transistor 31 has a source connected to the drain of P-channel transistor 33, a gate for receiving input signal IN, and a drain for providing output signal OUT at output terminal 101. N-channel transistor 32 has a drain connected to the drain of P-channel transistor 31, a gate connected to the gate of P-channel transistor 31, and a source. N-channel transistor 34 has a drain connected to the source of N-channel transistor 32, a gate for receiving control signal TS*, and a source connected to a power supply voltage terminal labeled "$V_{SS}$". N-channel transistor 40 has a first drain/source terminal connected to the gates of transistors 31 and 32, a gate for receiving control signal KILLP*, and a second drain/source terminal. P-channel transistor 39 has a source connected to $V_{DD}$, a gate connected to the gate of N-channel transistor 40, and a drain connected to the second drain/source terminal of N-channel transistor 40. P-channel transistor 42 has a first drain/source terminal connected to the gates of transistors 31 and 32, a gate for receiving control signal KILLN, and a second drain/source terminal. N-channel transistor 41 has a drain connected to the second drain/source terminal of P-channel transistor 42, a gate connected to the gate of P-channel transistor 42, and a source connected to $V_{SS}$.

P-channel transistor 37 has a source connected to $V_{DD}$, a gate connected to the second drain/source terminal of N-channel transistor 40, and a drain for providing output signal OUT at output terminal 101. N-channel transistor 38 has a drain connected to the drain of P-channel transistor 37, a gate connected to the second drain/source terminal of P-channel transistor 42, and a source connected to $V_{SS}$. A transmission line 43 has a near end connected to output terminal 101, and a far end. The far end is connected to a receiver (not shown) which could be an input terminal of a logic circuit, or the like.

Input signal IN is a digital signal from a memory, microprocessor, or other type of integrated circuit that can represent data, a control signal, or other type of digital signal. Output signal OUT is a logical complement of input signal IN, and is provided to transmission line 43, which may be a bus, printed circuit board trace, or other type of relatively long metal line for transporting digital signals. In a preferred embodiment, output signal OUT is provided at TTL (transistor-transistor logic) levels, but in other embodiments, output signal OUT can be provided at other logic levels, such as ECL (emitter-coupled logic), CMOS logic, or the like. High impedance driver circuit portion 30 has an output impedance of about 50–75 ohms, or whatever impedance is needed to match the impedance of transmission line 43, and low impedance driver circuit portion 36 has a relatively lower impedance, depending on the amount of driving ability needed. Driver circuit portions 30 and 36 together provide a high drive capability and are used to initially drive transmission line 43. Output signal OUT is also received by sensing circuit 24, which senses when output signal OUT is within a predetermined voltage of the steady state value of output signal OUT in one of two logic levels. Then, driver circuit portion 36 is turned off and driver circuit portion 30 continues to drive transmission line 43. Since the output impedance of driver circuit portion 30 closely matches the characteristic impedance of the transmission line, the reflected signals from the far end are absorbed by driver circuit portion 30, thereby reducing ringing.

Control signals TS and TS* are tristate control signals which allow output terminal 101 to be undriven, or left floating, if not used. Differential control signals TS and TS* cause P-channel transistor 33 and N-channel transistor 34 to be conductive, thus deactivating driver circuit portion 30, and cause control signals KILLN and KILLP* to both become active, thus deactivating driver circuit portion 36.

In operation, when input signal IN transitions from a logic high voltage to a logic low voltage, output signal OUT transitions from a logic low voltage to a logic high voltage. During the transition of output signal OUT from the logic low to the logic high voltage, control signal KILLP* is a logic high voltage, causing N-channel transistor 40 to be conductive and P-channel transistor 39 to be non-conductive. P-channel transistor 37 and P-channel transistor 31 rapidly increase the voltage of output signal OUT at output terminal 101. When output signal OUT reaches a predetermined voltage level below the logic high voltage, control signals KILLP* and KILLN become a logic low voltage. N-channel transistor 40 becomes substantially non-conductive, and P-channel transistor 39 becomes conductive. This prevents driver circuit portion 36 from affecting the voltage level of output signal OUT when output signal OUT nears the end of the transition. P-channel transistor 31 continues to drive output signal OUT until output signal OUT reaches it steady state logic high voltage.

When input signal IN transitions from a logic low to a logic high voltage, output signal OUT transitions from a logic high voltage to a logic low voltage. Control signal KILLN is a logic low voltage, which causes P-channel transistor 42 to be conductive and N-channel transistor 41 to be substantially non-conductive. This allows input signal IN to be provided to the gate of N-channel transistor 38 of driver circuit portion 36. N-channel transistors 32 and 38 rapidly decrease the voltage of output signal OUT at output terminal 101. As output signal OUT decreases to within a predetermined voltage above the steady state logic low voltage of output signal OUT, control signal KILLN becomes a logic high voltage. This causes P-channel transistor 38 to be substantially non-conductive, and N-channel transistor 32 continues to reduce the voltage of output signal OUT to its steady state logic low voltage.

Figure 3:
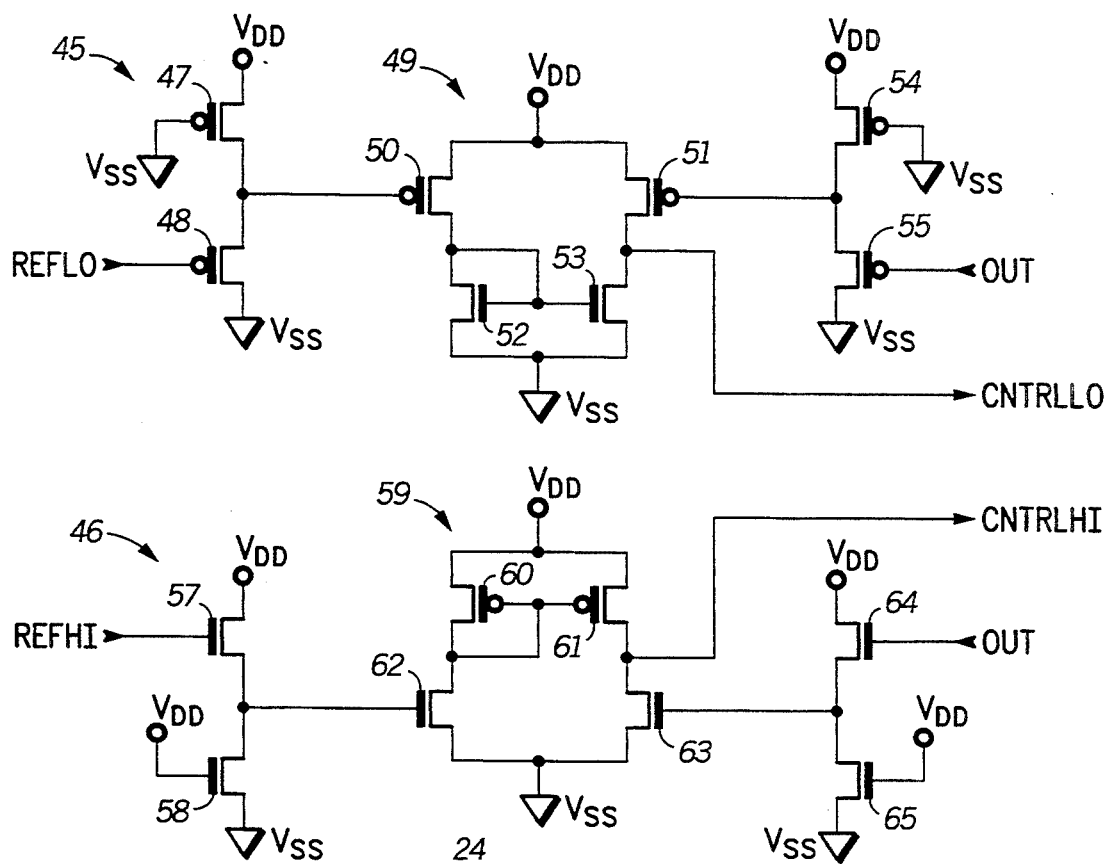
FIG. 3 illustrates in schematic diagram form, the sensing circuits of FIG.

FIG. 3 illustrates in schematic diagram form, sensing circuits 24 of FIG. 1. Sensing circuits 24 includes first sensing circuit 45 and second sensing circuit 46. First sensing circuit 45 includes P-channel transistors 47, 48, 54, and 55, and differential amplifier 49. Differential amplifier 49 includes P-channel transistors 50 and 51, and N-channel transistors 52 and 53. Second sensing circuit 46 includes N-channel transistors 57, 58, 64, and 65, and differential amplifier 59. Differential amplifier 59 includes P-channel transistors 60 and 61, and N-channel transistors 62 and 63.

In first sensing circuit 45, P-channel transistor 47 has a source connected to $V_{DD}$, a gate connected to $V_{SS}$, and a drain. P-channel transistor 48 has a source connected to the drain of P-channel transistor 47, a gate for receiving reference voltage REFLO, and a drain connected to $V_{SS}$. P-channel transistor 50 has a source connected to $V_{DD}$, a gate connected to the drain of P-channel transistor 47, and a drain. P-channel transistor 51 has a source connected to $V_{DD}$, a gate, and a drain for providing control signal CNTRLLO. N-channel transistor 52 has a drain connected to the drain of P-channel transistor 50, a gate connected to the drain of P-channel transistor 50, and a source connected to $V_{SS}$. N-channel transistor 53 has a drain connected to the drain of P-channel transistor 51, a gate connected to the gate of N-channel transistor 52, and a source connected to $V_{SS}$. P-channel transistor 54 has a source connected to $V_{DD}$, a gate connected to $V_{SS}$, and a drain connected to the gate of P-channel transistor 51. P-channel transistor 55 has a source connected to the drain of P-channel transistor 54, a gate for receiving output signal OUT, and a drain connected to $V_{SS}$.

In second sensing circuit 46, N-channel transistor 57 has a drain connected to $V_{DD}$, a gate for receiving reference voltage REFHI, and a source. N-channel transistor 58 has a drain connected to the source of N-channel transistor 57, a gate connected to $V_{DD}$, and a source connected to $V_{SS}$. P-channel transistor 60 has a source connected to $V_{DD}$, a gate, and a drain. P-channel transistor 61 has a source connected to $V_{DD}$, a gate connected to the gate of P-channel transistor 60, and a drain for providing control signal CNTRLHI. N-channel transistor 62 has a drain connected to both the drain and gate of P-channel transistor 60, a gate connected to the source of N-channel transistor 57, and a source connected to $V_{SS}$. N-channel transistor 63 has a drain connected to the drain of P-channel transistor 61, a gate, and a source connected to $V_{SS}$. N-channel transistor 64 has a drain connected to $V_{DD}$, a gate for receiving output signal OUT, and a source connected to the gate of N-channel transistor 63. N-channel transistor 65 has a drain connected to the source of N-channel transistor 64, a gate connected to $V_{DD}$, and a source connected to $V_{SS}$.

Reference voltage REFLO is equal to a predetermined voltage above $V_{SS}$, and reference voltage REFHI is equal to a predetermined voltage below $V_{DD}$. $V_{DD}$ is a positive power supply voltage and $V_{SS}$ is ground. However, in other embodiments, $V_{SS}$ could be a negative voltage and $V_{DD}$ could be ground. The potential of reference voltages REFHI and REFLO is determined by the signal swing of output signal OUT. As stated above, in a preferred embodiment, output signal OUT is a TTL level signal, and the predetermined voltage is equal to about 0.8 volts, assuming a power supply voltage of about 5.0 volts. Sensing circuits 45 and 46 detect when output signal OUT crosses reference voltages REFLO and REFHI, and in response, provides control signals CNTRLLO and CNTRLHI. Differential amplifiers 49 and 59 are relatively slow. Therefore, P-channel transistors 47 and 54 and N-Channel transistors 58 and 65 provide a level shifting function, that results in differential amplifiers 49 and 59 operating in a higher gain portion of their operating range.

In sensing circuit 45, output signal OUT is compared to reference voltage REFLO. If output signal OUT is a higher voltage than reference voltage REFLO, then relatively more current is steered through P-channel transistor 50 than through P-channel transistor 51, and control signal CNTRLLO is provided as a logic low. If output signal OUT is a lower voltage than reference voltage REFLO, then more current is steered through P-channel transistor 51 and control signal CNTRLLO is provided as a logic high.

Sensing circuit 46 operates similarly to sensing circuit 45. If output signal OUT is a lower voltage than reference voltage REFHI, then more current is steered through N-channel transistor 62 than through N-channel transistor 63, and control signal CNTRLHI is provided as a logic high. If output signal OUT is a higher voltage than reference voltage REFHI, then more current is steered through N-channel transistor 63 and control signal CNTRLHI is provided as a logic low.

Figure 4:
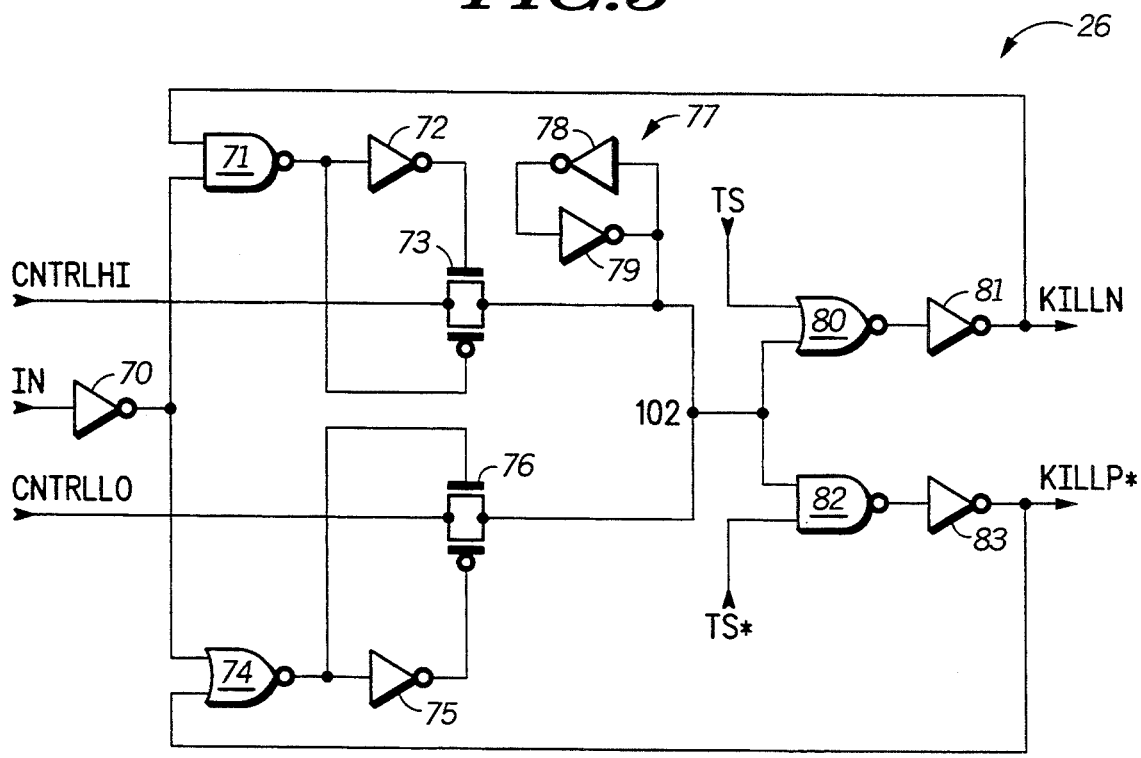
FIG. 4 illustrates in partial logic diagram form and partial schematic diagram form, the select logic circuit of FIG. 1.

FIG. 4 illustrates in partial logic diagram form and partial schematic diagram form, select logic circuit 26 of FIG. 1. Select logic circuit 26 includes NAND logic gates 71 and 82, NOR logic gates 74 and 80, inverters 70, 72, 75, 81, and 83, latch 77, and transmission gates 73 and 76. Latch 77 includes inverters 78 and 79. Inverter 70 has an input terminal for receiving input signal IN, and an output terminal. NAND logic gate 71 has a first input terminal, a second input terminal connected to the output terminal of inverter 70, and an output terminal. Inverter 72 has an input terminal connected to the output terminal of NAND logic gate 71, and an output terminal. Transmission gate 73 has an input terminal for receiving control signal CNTRLHI, a first control terminal connected to the output terminal of inverter 72, a second control terminal connected to the output terminal of NAND logic gate 71, and an output terminal. Inverter 78 has an input terminal connected to the output terminal of transmission gate 73, and an output terminal. Inverter 79 has an input terminal connected to the output terminal of inverter 78, and an output terminal connected to the output terminal of transmission gate 73. NOR logic gate 74 has a first input terminal connected to the output terminal of inverter 70, a second input terminal, and an output terminal. Inverter 75 has an input terminal connected to the output terminal of NOR logic gate 74, and an output terminal. Transmission gate 76 has an input terminal for receiving control signal CNTRLLO, a first control terminal connected to the output terminal of NOR logic gate 74, a second control terminal connected to the output terminal of inverter 75, and an output terminal connected to the output terminal of transmission gate 73.

NOR logic gate 80 has a first input terminal for receiving control signal TS, a second input terminal connected to the output terminals of transmission gates 73 and 76, and an output terminal. Inverter 81 has an input terminal connected to the output terminal of NOR logic gate 80, and an output terminal connected to the first input terminal of NAND logic gate 71 for providing control signal KILLN. NAND logic gate 82 has a first input terminal connected to the output terminals of transmission gates 73 and 76, a second input terminal for receiving control signal TS*, and an output terminal. Inverter 83 has an input terminal connected to the output terminal of NAND logic gate 82, and an output terminal connected to the second input terminal of NOR logic gate 74 for providing control signal KILLP*.

In operation, select logic circuit 26 provides control signals KILLN and KILLP* for controlling driver circuits 22 (FIG. 2), based on the logic states of control signals CNTRLHI and CNTRLLO and input signal IN.

When input signal IN transitions from a logic high to a logic low, output signal OUT transitions from a logic low to a logic high. Transmission gate 73 is conductive. Transmission gate 76 is substantially non-conductive because input signal IN is a logic low. P-channel transistors 31 and 37 work together to rapidly increase the voltage of output signal OUT at output terminal 101. The voltage of output signal OUT increases until output signal OUT crosses reference voltage REFHI. Control signal CNTRLHI then becomes a logic low, and since transmission gate 73 is conductive, control signals KILLP* and KILLN are both at a logic low, causing P-channel transistor 37 to be non-conductive. P-channel transistor 42 (FIG. 2) is conductive because control signal KILLN is a logic low, and N-channel transistor 38 is substantially non-conductive. P-channel transistor 31 continues to increase the voltage of output signal OUT to its steady state logic high voltage. Latch 77 temporarily latches node 102 to a logic low, preventing control signals KILLN and KILLP* from changing logic states in case output signal OUT overshoots and then undershoots its steady state voltage and re-crosses reference voltage REFHI. Reflected waves from the far end of transmission line 43 are absorbed by driver circuit portion 30 because the output impedance of driver circuit portion 30 closely matches the characteristic impedance of transmission line 43.

When input signal IN transitions from a logic low to a logic high, output signal OUT transitions from a logic high to a logic low. Transmission gate 76 is conductive. Transmission gate 73 is substantially non-conductive because input signal IN is a logic high. N-channel transistors 32 and 38 work together to rapidly decrease the voltage of output signal OUT at output terminal 101 until output signal OUT crosses reference voltage REFLO. Control signal CNTRLLO then becomes a logic high. Because transmission gate 76 is conductive, control signals KILLN and KILLP* are both a logic high, thus causing N-channel transistor 38 to be non-conductive. Control signal KILLP* is a logic high, which causes N-channel transistor 40 (FIG. 2) to be conductive, and P-channel transistor 37 to be non-conductive. N-channel transistor 32 continues to decrease the voltage of output signal OUT to its steady state logic low voltage. Latch 77 temporarily latches node 102 to a logic high, preventing control signals KILLN and KILLP* from changing logic states in case output signal OUT undershoots and then overshoots it steady state voltage and re-crosses reference voltage REFLO.

CMOS driver circuit 20 provides the advantages of maintaining strong drive capability for heavily capacitive loads and high speed operation, while matching the characteristic impedance of the transmission line for absorbing reflected waves from the far end of the transmission line, thus reducing ringing. Reducing the ringing increases noise immunity, and provides less delay from the time the driver transition occurs until the far end signal is usable.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A driver circuit with self-adjusting impedance matching, comprising:
   a first driver portion having an output terminal of a first output impedance, the first driver portion for driving an output signal on a transmission line in response to a control signal being in a first logic state;
   a second driver portion having an output terminal of a second output impedance coupled to the output terminal of the first driver portion, the second driver portion for driving the output signal on the transmission line; and
   a sensing circuit, coupled to the output terminals of the first and second driver portions, for sensing when the output signal reaches a predetermined voltage before the output signal reaches a steady state voltage while the output signal is transitioning from a first voltage level to a second voltage level, and in response to the output signal reaching the predetermined voltage, the sensing circuit causing the control signal to change from the first logic state to a second logic state.

2. The driver circuit of claim 1, wherein the first output impedance is lower than the second output impedance, and the second impedance is substantially equal to a characteristic impedance of a transmission line coupled to the output terminal.

3. The driver circuit of claim 1, wherein the first driver portion comprises:
   a first P-channel transistor having a first current electrode coupled to a first power supply voltage terminal, a control electrode, and a second current electrode for providing the output signal; and
   a first N-channel transistor having a first current electrode coupled to the second current electrode of the first P-channel transistor, a control electrode, and a second current electrode coupled to a second power supply voltage terminal.

4. The driver circuit of claim 3, wherein the second driver portion comprises:
   a second P-channel transistor having a first current electrode coupled to the first power supply voltage terminal, a control electrode for receiving an input signal, and a second current electrode for providing the output signal; and
   a second N-channel transistor having a first current electrode coupled to the second current electrode of the second P-channel transistor, a control electrode for receiving the input signal, and a second current electrode coupled to the second power supply voltage terminal.

5. The driver circuit of claim 4, further comprising:
   a third N-channel transistor having a first current electrode coupled to the control electrode of the second P-channel transistor, a control electrode for receiving the control signal, and a second current electrode coupled to the control electrode of the first P-channel transistor;
   a third P-channel transistor having a first current electrode coupled to the control electrode of the second N-channel transistor, a control electrode for receiving a second control signal, and a second current electrode coupled to the control electrode of the first N-channel transistor;
   a fourth P-channel transistor having a first current electrode coupled to the first power supply voltage terminal, a control electrode coupled to the control electrode of the third N-channel transistor, and a second current electrode coupled to the second current electrode of the third N-channel transistor; and
   a fourth N-channel transistor having a first current electrode coupled to the second current electrode of the third P-channel transistor, a control electrode coupled to the control electrode of the third P-channel transistor, and a second current electrode coupled to the second power supply voltage terminal.

6. The driver circuit of claim 5, wherein the sensing circuit comprises:
   a first differential amplifier having a first input terminal for receiving a first reference voltage, a second input terminal for receiving the output signal, and an output terminal for providing the control signal; and
   a second differential amplifier having a first input terminal for receiving a second reference voltage, a second input terminal for receiving the output signal, and an output terminal for providing the second control signal.

7. The driver circuit of claim 1, further comprising a select logic circuit, coupled to the sensing circuit, for ensuring that the control signal remains in the second logic state when the output signal reaches the predetermined voltage.

8. The driver circuit of claim 7, further comprising means for tristating the driver circuit.

9. A CMOS driver circuit with self-adjusting impedance matching, comprising:
   a first driver portion having an output terminal of a first output impedance, the first driver portion for driving a transmission line;
   a second driver portion having an output terminal of a second output impedance, the second driver portion for driving the transmission line, the output terminal of the second driver portion being coupled to the output terminal of the first driver portion;
   a first differential amplifier circuit having a first input terminal for receiving a first reference voltage, a second input terminal coupled to the transmission line, and an output terminal for providing a first control signal; and
   a second differential amplifier circuit having a first input terminal for receiving a second reference voltage, a second input terminal coupled to the transmission line, and an output terminal for providing a second control signal;
   wherein both the first and second driver portions initially drive the transmission line as an output signal transitions from a first voltage level to a second voltage level, and when the output signal reaches a predetermined voltage from the first or second voltage levels, either the first or the second control signal causing the first driver portion to be disabled.

10. The CMOS driver circuit of claim 9, wherein the first driver portion comprises:
    a first P-channel transistor having a first current electrode coupled to a first power supply voltage terminal, a control electrode, and a second current electrode for providing the output signal; and
    a first N-channel transistor having a first current electrode coupled to the second current electrode of the first P-channel transistor, a control electrode, and a second current electrode coupled to a second power supply voltage terminal.

11. The CMOS driver circuit of claim 10, wherein the second driver portion comprises:
    a second P-channel transistor having a first current electrode coupled to the first power supply voltage terminal, a control electrode, and a second current electrode for providing the output signal; and
    a second N-channel transistor having a first current electrode coupled to the second current electrode of the second P-channel transistor, a control electrode, and a second current electrode coupled to the second power supply voltage terminal.

12. The CMOS driver circuit of claim 9, wherein the first output impedance is less than the second output impedance, and the second output impedance is substantially equal to a characteristic impedance of the transmission line.

13. The CMOS driver circuit of claim 9, wherein the first reference voltage is equal to a predetermined value, and the second reference voltage is equal to about a first power supply voltage minus the predetermined value.

14. The CMOS driver circuit of claim 9, further comprising a select logic circuit, the select logic circuit coupled to the first and second differential amplifiers and to the first and second driver portions, the select logic circuit for ensuring that the first driver portion remains disabled when the output signal ends a transition from a high voltage level to a low voltage level, or the output signal ends a transition from the low voltage level to the high voltage level.

15. The CMOS driver circuit of claim 14, wherein the select logic circuit comprises:
    a first inverter having an input terminal for receiving an input signal, and an output terminal;

a first NAND logic gate having a first input terminal, a second input terminal coupled to the output terminal of the first inverter, and an output terminal;

a first NOR logic gate having a first input terminal coupled to the output terminal of the first inverter, a second input terminal, and an output terminal;

a second inverter having an input terminal coupled to the output terminal of the first NAND logic gate, and an output terminal;

a third inverter having an input terminal coupled to the output terminal of the first NOR logic gate, and an output terminal;

a first transmission gate having an input terminal for receiving the second control signal, an output terminal, a first control terminal coupled to the output terminal of the second inverter, and a second control terminal coupled to the output terminal of the first NAND logic gate;

a second transmission gate having an input terminal for receiving the first control signal, an output terminal coupled to the output terminal of the first transmission gate, a first control terminal coupled to the output terminal of the first NOR logic gate, and a second control terminal of the third inverter;

a latch, coupled to the output terminals of the first and second transmission gates;

a second NOR logic gate having a first input terminal for receiving a first tristate control signal, a second input terminal coupled to the output terminals of the first and second transmission gates, and an output terminal;

a second NAND logic gate having a first input terminal coupled to the output terminals of the first and second transmission gates, a second input terminal for receiving a second tristate control signal, and an output terminal;

a fourth inverter having an input terminal coupled to the output terminal of the second NOR logic gate, and an output terminal coupled to the first input terminal of the first NAND logic gate; and a fifth inverter having an input terminal coupled to the output terminal of the second NAND logic gate, and an output terminal coupled to the second input terminal of the first NOR logic gate.

16. A CMOS driver circuit with self-adjusting impedance matching, comprising:

a first driver portion having an output terminal of a first output impedance, the first driver portion for driving a transmission line in response to first and second control signal being inactive;

a second driver portion having an output terminal of a second output impedance, the second driver portion for driving the transmission line, the output terminal of the second driver portion being coupled to the output terminal of the first driver portion, the first output impedance being less than the second output impedance;

a first differential amplifier circuit having a first input terminal for receiving a first reference voltage, a second input terminal coupled to the output terminals of both of the first and second driver portions, and an output terminal for providing a third control signal;

a second differential amplifier circuit having a first input terminal for receiving a second reference voltage, a second input terminal coupled to the output terminal of both of the first and second driver portions, and an output terminal for providing a fourth control signal; and a select logic circuit having a first input terminal coupled to the output terminal of the first differential amplifier circuit for receiving the third control signal, a second input terminal coupled to the output terminal of the second differential amplifier circuit for receiving the fourth control signal, a third input terminal for receiving an input signal, and first and second output terminals for providing the first and second control signals, respectively;

wherein both the first and second driver portions drive the transmission line as an output signal on the transmission line transitions from a low voltage level to a high voltage level, and when the output signal reaches a first predetermined voltage below the high voltage level, as determined by the first reference voltage, the first control signal becomes active to disable the first driver portion; and wherein both the first and second driver portions drive the transmission line as the output signal transitions from the high voltage level to the low voltage level, and when the output signal reaches a second predetermined voltage above the low voltage level, as determined by the second reference voltage, the second control signal becomes active to disable the first driver portion.

17. The CMOS driver circuit of claim 16, wherein the first driver portion comprises:

a first P-channel transistor having a first current electrode coupled to a first power supply voltage terminal, a control electrode, and a second current electrode; and a first N-channel transistor having a first current electrode coupled to the second current electrode of the first P-channel transistor, a control electrode, and a second current electrode coupled to a second power supply voltage terminal.

18. The CMOS driver circuit of claim 17, wherein the second driver portion comprises:

a second P-channel transistor having a first current electrode coupled to the first power supply voltage terminal, a control electrode for receiving the input signal, and a second current electrode for providing the output signal; and a second N-channel transistor having a first current electrode coupled to the second current electrode of the second P-channel transistor, a control electrode for receiving the input signal, and a second current electrode coupled to the second power supply voltage terminal.

19. The CMOS driver circuit of claim 18, further comprising:

a third P-channel transistor coupled between the first current electrode of the second P-channel transistor and the first power supply voltage terminal, the third P-channel transistor responsive to a first tristate control signal; and a third N-channel transistor coupled between the second current electrode of the second N-channel transistor and the second power supply voltage terminal, the third P-channel transistor responsive to a second tristate control signal.

20. The CMOS driver circuit of claim 16, further comprising:

a third N-channel transistor having a first current electrode coupled to the control electrode of the second P-channel transistor, a control electrode for receiving the first control signal, and a second current electrode coupled to the control electrode of the first P-channel transistor;

a third P-channel transistor having a first current electrode coupled to the control electrode of the second N-channel transistor, a control electrode for receiving the second control signal, and a second current electrode coupled to the control electrode of the first N-channel transistor;

a fourth P-channel transistor having a first current electrode coupled to the first power supply voltage terminal, a control electrode coupled to the control electrode of the third N-channel transistor, and a second current electrode coupled to the second current electrode of the third N-channel transistor; and a fourth N-channel transistor having a first current electrode coupled to the second current electrode of the third P-channel transistor, a control electrode coupled to the control electrode of the third P-channel transistor, and a second current electrode coupled to the second power supply voltage terminal.

21. The CMOS driver circuit of claim 16, wherein the select logic circuit comprises:

a first inverter having an input terminal for receiving an input signal, and an output terminal;

a first NAND logic gate having a first input terminal, a second input terminal coupled to the output terminal of the first inverter, and an output terminal;

a first NOR logic gate having a first input terminal coupled to the output terminal of the first inverter, a second input terminal, and an output terminal;

a second inverter having an input terminal coupled to the output terminal of the first NAND logic gate, and an output terminal;

a third inverter having an input terminal coupled to the output terminal of the first NOR logic gate, and an output terminal;

a first transmission gate having an input terminal for receiving the second control signal, an output terminal, a first control terminal coupled to the output terminal of the second inverter, and a second control terminal coupled to the output terminal of the first NAND logic gate;

a second transmission gate having an input terminal for receiving the first control signal, an output terminal coupled to the output terminal of the first transmission gate, a first control terminal coupled to the output terminal of the first NOR logic gate, and a second control terminal of the third inverter;

a latch, coupled to the output terminals of the first and second transmission gates;

a second NOR logic gate having a first input terminal for receiving a first tristate control signal, a second input terminal coupled to the output terminals of the first and second transmission gates, and an output terminal;

a second NAND logic gate having a first input terminal coupled to the output terminals of the first and second transmission gates, a second input terminal for receiving a second tristate control signal, and an output terminal;

a fourth inverter having fin input terminal coupled to the output terminal of the second NOR logic gate, and an output terminal coupled to the first input terminal of the first NAND logic gate; and a fifth inverter having an input terminal coupled to the output terminal of the second NAND logic gate, and an output terminal coupled to the second input terminal of the first NOR logic gate.

* * * * *